US009111737B2

(12) United States Patent
Giomataris et al.

(10) Patent No.: US 9,111,737 B2
(45) Date of Patent: Aug. 18, 2015

(54) METHOD FOR FABRICATING AN AMPLIFICATION GAP OF AN AVALANCHE PARTICLE DETECTOR

(75) Inventors: Ioannis Giomataris, Versailles (FR); Rui De Oliveira, Arenthon (FR)

(73) Assignees: CERN—European Organization for Nuclear Research, Geneva (CH); CEA, Gif-Sur-Yvette (FR)

( * ) Notice: Subject to any disclaimer, the term of this patent is extended or adjusted under 35 U.S.C. 154(b) by 246 days.

(21) Appl. No.: 13/503,211

(22) PCT Filed: Sep. 17, 2010

(86) PCT No.: PCT/EP2010/005729
§ 371 (c)(1), (2), (4) Date: Jul. 3, 2012

(87) PCT Pub. No.: WO2011/050884
PCT Pub. Date: May 5, 2011

(65) Prior Publication Data

US 2012/0264064 A1 Oct. 18, 2012

(30) Foreign Application Priority Data

Oct. 28, 2009 (EP) .................................... 09290825

(51) Int. Cl.
*H05K 13/00* (2006.01)
*H01J 47/06* (2006.01)

(52) U.S. Cl.
CPC ............... *H01J 47/065* (2013.01); *H01J 47/06* (2013.01)

(58) Field of Classification Search
CPC ...... C09K 13/02; H01J 47/065; G01T 1/1645
USPC ................................ 216/83, 17, 99; 430/319
See application file for complete search history.

(56) References Cited

U.S. PATENT DOCUMENTS 5,742,061 A * 4/1998 Lemonnier et al. ........ 250/385.1
7,135,119 B2 11/2006 De Oliveira .................... 216/18

FOREIGN PATENT DOCUMENTS

EP 0 855 086 7/1998 .............. H01J 47/02
EP 0855086 7/1998 .............. H01J 47/02

(Continued)

OTHER PUBLICATIONS

European Patent Office, *International Search Report and the Written Opinion of the International Searching Authority*—International Application No. PCT/EP2010/005729, dated Dec. 14, 2010 (10 pages).

(Continued)

*Primary Examiner* — Duy Deo
*Assistant Examiner* — Mahmoud Dahimene
(74) *Attorney, Agent, or Firm* — Sunstein Kann Murphy & Timbers LLP

(57) ABSTRACT

The invention relates to an improved method for fabricating the amplification gap of an avalanche particle detector in which two parallel electrodes are spaced apart by dielectric spacer elements. A foil including a bulk layer made of dielectric material sandwiched by two mutually parallel metallic electrodes is provided, and holes are formed in one of the metallic layers by means of photolithography. The amplification gap is then formed in the bulk layer by means of carefully controlled etching of the bulk material through the holes formed in one of the metallic layers. The invention not only provides a simplified fabrication process, but also results in a detector with enhanced spatial and energy resolution.

11 Claims, 4 Drawing Sheets

(56) References Cited

FOREIGN PATENT DOCUMENTS

Figure 1A:
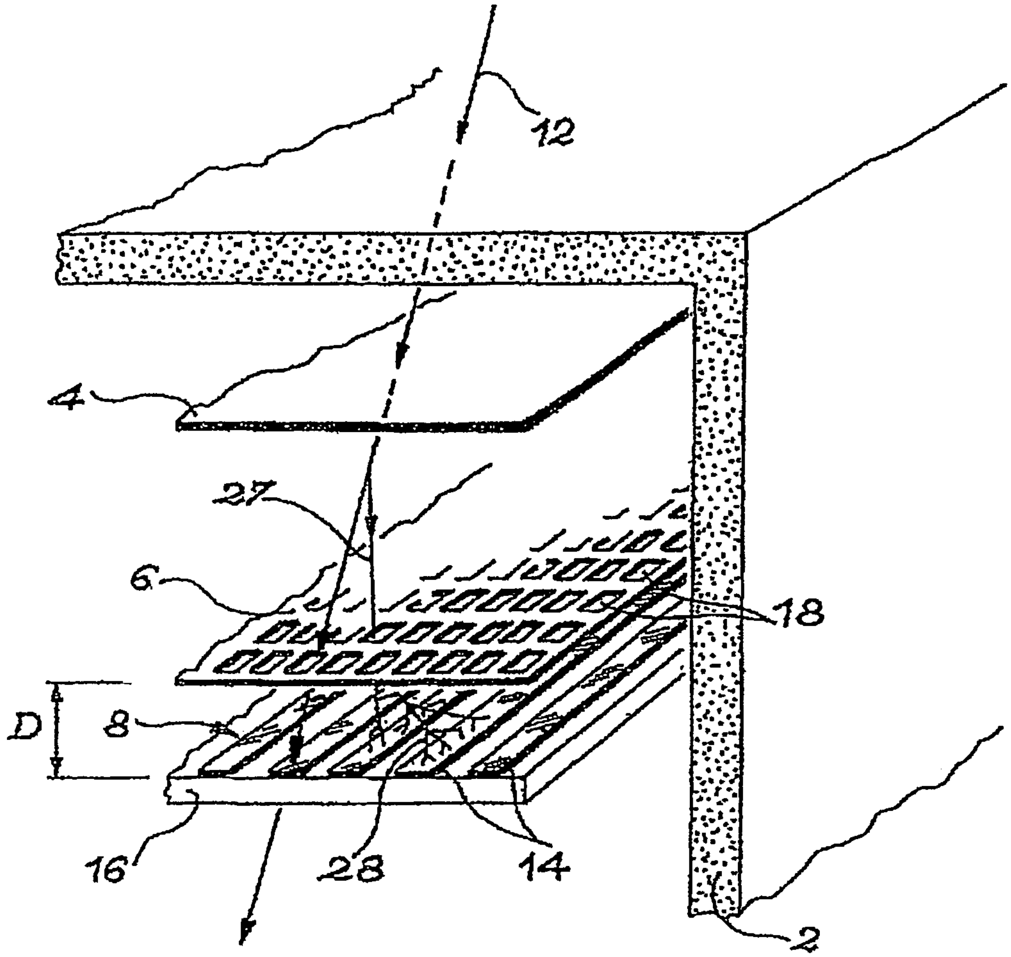

| | | | | |
|---|---|---|---|---|
| EP | 0 872 874 | | 10/1998 | H01J 47/00 |
| JP | 2005-513804 A | | 5/2005 | H05K 3/46 |
| JP | 2007250866 | * | 9/2007 | H05K 1/03 |
| JP | 2009-028993 A | | 2/2009 | B32B 15/088 |
| WO | WO 9003043 | * | 3/1990 | H01J 49/02 |
| WO | WO 00/30150 | | 5/2000 | H01J 47/02 |
| WO | WO 2004/086964 | | 10/2004 | A61B 5/00 |
| WO | WO 2009/127220 A1 | | 10/2009 | H01J 43/06 |
| WO | WO 2011/050884 | | 5/2011 | H01J 47/06 |

OTHER PUBLICATIONS

European Patent Office, *Extended European Search Report*—International Application No. 09290825.0-1232, dated Apr. 8, 2010 (6 pages).

* cited by examiner

METHOD FOR FABRICATING AN AMPLIFICATION GAP OF AN AVALANCHE PARTICLE DETECTOR

The present invention relates to a novel technique for fabricating an amplification gap of an avalanche particle detector by means of etching of a dielectric layer sandwiched between two thin metallic layers.

Particle detectors are devices to detect, track, and/or identify radiation or particles, and find wide applications throughout particle physics, biology, as well as medical technology.

The Micromegas detector is a gaseous parallel plate avalanche detector, in which ionizing incident particles produce a cascade of ion-electron pairs in the strong electric field between a micromesh cathode plate an a charge-collecting anode plate.

The Micromegas detector is known from the publication "MICROMEGAS: a high-granularity position-sensitive gaseous detector for high particle-flux environments", Y. Giomataris, P. Rebourgeard, J. P. Robert, G. Charpak, Nuclear Instruments and Methods in Physics Research A 376 (1996) pages 29 to 35, as well as from the related patent applications EP 0 855 086 B1, EP 0 872 874 B1, and WO 00/30150, and will now briefly be described with reference to FIG. 1*a*, which has been taken from EP 0 872 874 B1.

The Micromegas detector comprises a low electric field conversion gap (or drift gap), filled with an adequate gas mixture, where ionizing incident particles create ion-electron pairs, and an adjacent high field amplification gap, where the generated electrons drift to and produce the final electron charge to be read out and analyzed. The collected electron charge may indicate the charge, energy, momentum, direction of travel, and other attributes of the incident particles.

The Micromegas detector comprises a gas chamber 2, provided with means for circulating an appropriate gas, for example a mixture of argon and methane. The detector further comprises first, second and third plane electrodes 8, 6 and 4 placed in this order in the gas chamber 2 and kept parallel to each other, wherein the first electrode 8 and the second electrode 6 delimit the amplification gap, while the second electrode 6 and the third electrode 4 delimit the conversion gap. The first electrode 8, which forms the anode of the detector, may comprise a plurality of elementary electrodes 14, which are arranged in parallel on an electrically insulating carrier substrate 16. In the example illustrated in FIG. 1*a*, the elementary electrodes 14 consist of electrically conducting strips, arranged in parallel at regular intervals on the electrically insulating substrate 16. The anode may also comprise another set of parallel conducting strips formed on the other surface of the carrier substrate 16 and perpendicular to the strips 14. A sufficient distance is provided between the strips 14 such that electrical pulses generated in the strips 14 can be induced in the set of perpendicular strips on the other surface of the substrate 16. In another embodiment of the Micromegas detector, the elementary electrodes of the anode 8 may comprise thin electrically conducting elements forming a two-dimensional checkerboard network on the substrate 16. Further alternative anode patterns will be described below.

The elementary electrodes 14 of the first electrode 8 are connected to readout means (not shown) adapted to extract the electrical charges collected on the elementary electrodes 14. The readout means may themselves be connected to amplifiers and data acquisition means (not shown) for analyzing the data collected by the detector.

The second electrode 6 serves as the cathode of the detector, and consists of an electrically conducting plate with a plurality of holes 18 of a small diameter. The cathode 6 hence forms a grid which, on account of the small size of its holes 18, is sometimes called a "microgrid", or "micromesh".

The distance D between the first electrode 8 and the second electrode 6 is typically in the range of 25 to 200 μm. The distance between the second electrode 6 and the third electrode 4 is much bigger, and may amount to approximately 3 mm. The structure of the third electrode 4 is irrelevant in the context of the present invention; for example, the third electrode 4 may consist of a grid with a structure similar to the structure of the second electrode 6.

The Micromegas detector further comprises polarization means capable of raising the elementary electrodes 14 of the first electrode 8 to a first potential, the cathode 6 to a second potential lower than the first potential, and the third electrode 4 to a third potential still lower than the second potential. Hence, a first electrical field is generated in the conversion gap between the second electrode 6 and the third electrode 4, and a second electric field is generated in the amplification gap between the first electrode 8 and the second electrode 6. The voltages are chosen such that the electrical field generated in the amplification gap is much stronger, for example more than ten times stronger, than the electrical field generated in the conversion gap. For instance, the electrical field generated in the conversion gap may amount to 1 kV/cm, while the electrical field generated by the amplification gap may be chosen at 40 to 150 KV/cm.

When an ionizing particle passes through the gas chamber 2, it ionizes the gas located in the conversion gap between the second electrode 6 and the third electrode 4 and typically creates about ten primary electrons in that gap. In FIG. 1, the path of the incident ionizing particle is denoted by reference numeral 12, whereas the path of one of the primary electrons generated in the conversion gap is denoted by reference numeral 27. The primary electrons pass through the holes 18 in the cathode 6 and then move towards the anode 8. The crossing through the cathode 6 is facilitated by the high ratio between the field created in the amplification gap and the field created in the conversion gap. After passing through the cathode 6, the primary electrons are accelerated by means of the strong field that exists in the amplification gap, and produce secondary electrons when colliding with gas molecules present inside the amplification gap. Each of the secondary electrons may then itself produce further electrons by the same impact ionization process, and so forth, so that an avalanche of electrons is generated inside the amplification gap. The avalanche associated with the primary electron along its path 27 is denoted by reference numeral 28.

The positive ions created by the impact ionization process are drawn towards the cathode 6, while the electrons are collected on the elementary anodes 14. The charge thus collected on the elementary anodes 14 is then read out and analyzed to infer the attributes of the incident particle 12. A narrow amplification gap in combination with the strong electrical field between the anode 8 and the cathode 6 ensures a high spatial resolution of the Micromegas detector as well as high amplification rates and quick recovery times.

Figure 1B:
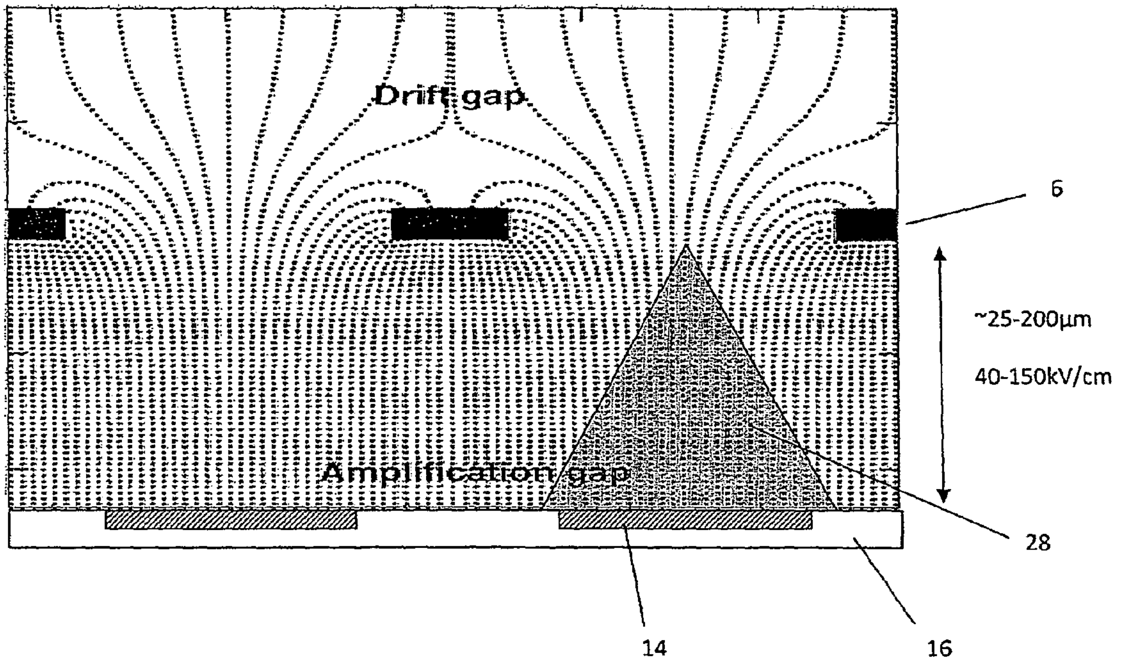

FIG. 1*b* shows the amplification gap between the cathode 6 and the anode strips 14 in additional detail. The electron avalanche 28 propagating towards the anode strips 14 is represented by a shaded triangle in FIG. 1*b*, while the electric field lines in the drift gap and the amplification gap, respectively, are represented by dotted lines. The significant increase of the density of the field lines in the amplification gap illustrates the high field ratio between the electric field created in the amplification gap and the electric field created in the drift gap.

In the traditional fabrication technique described in detail in the patent applications EP 0 872 874 B1 and WO 00/30150, the amplification gap of the Micromegas detector is obtained by printing adequate insulating spacers, which may consist of cylindrical pillars, on top of the anode plate by conventional lithography of a photoresistive film, and then stretching and gluing a metallic mesh on a frame and resting it on top of the spacers. In this way, the cathode 6 is formed by suspending the mesh over the anode strips or pads, and the spacers serve to ensure a constant distance between the cathode 6 and the anode 8.

The present invention is directed at an improved method for forming the amplification gap of an avalanche particle detector. Instead of first producing the anode plate, then forming the spacer elements on said anode plate, and finally suspending a mesh on said spacer elements, according to the present invention the detector can also be built in a single process by providing a bulk structure in which the anode plate, a dielectric material and a cathode plate initially form a single object, and the mesh and the spacer elements are then formed by selective etching.

In general terms, the invention relates to a method for fabricating an amplification gap of an avalanche particle detector in which two parallel electrodes are spaced apart by dielectric spacer elements, comprising the steps of: forming a foil including a first electrode layer, a bulk layer comprising a dielectric material on said first electrode layer, and a second electrode layer parallel to said first electrode layer on said bulk layer, wherein said second electrode layer comprises a plurality of holes extending therethrough. The method according to the present invention further comprises the step of forming a plurality of gaps in said bulk layer in correspondence to said plurality of holes in said second electrode layer by means of etching, wherein said gaps extend through said bulk layer in a vertical direction thereof to said first electrode layer and in a horizontal direction thereof parallel to said second electrode layer, so that said second electrode layer is at least partially undercut by said gaps.

By forming the amplification gap of the detector from a single piece of material instead of composing the amplification gap of several different components, the precision of the manufacturing process can be significantly enhanced. In particular, it can be guaranteed that the anode and the cathode of the detector are almost perfectly parallel to each other, hence improving the spatial and energy resolution of the detector device. Moreover, the method according to the present invention leads to a flexible detector structure and allows for easier mesh segmentation.

The method according to the present invention may further comprise a hole forming step wherein said plurality of holes in said second electrode layer are formed by means of photolithography. Photolithography provides a convenient and flexible means for creating holes with precisely specified diameters at precisely defined positions in said second electrode layer.

As described above with reference to FIGS. 1*a* and 1*b*, a plurality of elementary electrodes insulated from each other may be formed in said first electrode layer. Such elementary electrodes may comprise a plurality of electrically conducting parallel strips, and/or a plurality of electrically conducting pads.

The first electrode layer and the second electrode layer preferably comprise copper.

The bulk layer may comprise one of polyimide, glass, or ceramics, and may be formed at a width between 25 μm and 50 μm. As explained above, by forming a thin amplification gap the spatial resolution of the detection may be significantly enhanced. By ensuring a constant distance between the first and second electrode layer, the energy resolution of the detector can be greatly improved.

In a preferred embodiment of the present invention, the gaps in the bulk layer are formed by means of liquid-phase etching, and preferably, an aqueous solution of ethylenediamine and potassium hydroxide is used in the process. Alternatively, the gaps in the bulk layer can also be formed by means of plasma etching.

Further, the step of forming said plurality of gaps may also comprise the step of first forming cylindrical openings within said bulk layer subjacent to said holes in said second electrode layer in a vertical direction by means of a first etching, and then etching sideways from said cylindrical openings in a direction parallel to said first electrode layer by means of a second etching.

In a preferred embodiment, said plurality of holes extending through said second electrode layer are formed at equidistant positions, so that also the gaps formed by means of etching through said holes are formed at equidistant positions in said bulk layer. The holes may be formed to have equal diameter, and the distance between any two neighbouring holes may be twice the diameter of said plurality of holes. For example, the holes may be circular with a diameter of 30 μm, and any two neighbouring holes may be separated by a pitch of 60 μm.

Preferably, spacer elements of bulk material are formed between two neighbouring gaps by means of the etching process. In particular, any two neighbouring gaps may be separated by one spacer element. This may be achieved by suitably adjusting the parameters of the etching process, such as the composition and temperature of the chemical bath. By performing the etching process in such a way that spacer elements are left between neighbouring holes, the well-known Micromegas structure with an amplification gap between two parallel electrodes can be obtained.

If any two neighbouring gaps are separated by a spacer element, a very homogeneous structure can be achieved in which the first electrode layer and the second electrode layer are perfectly parallel, and hence the energy resolution is particularly high.

Alternatively, neighbouring holes in said second electrode layer may be formed at varying mutual distances. In particular, neighboring holes may have a first distance or a second distance greater than said first distance, and the etching may be performed such that the bulk material between neighbouring gaps is entirely removed between those gaps that are formed from neighbouring holes at said first distance, and spacer elements of bulk material are left by the etching between those gaps that are formed from neighbouring holes at said second distance. Again, this may be achieved by suitably tuning the etching parameters, for instance by adjusting the temperature and composition of the chemical bath used in the etching process. The resulting structure is similar to the one described above, but has comparatively fewer spacer elements and larger gaps. Hence, the ratio between free space and supporting bulk material in the amplification gap is increased. Therefore, the uniformity of the electric field between the cathode and the anode is likewise increased, and the danger of discharges can be significantly reduced.

The spacer elements supporting the cathode may be positioned to extend between the elementary electrodes and the second electrode layer. Alternatively, the spacer elements may extend between the insulating material separating said elementary electrodes and said second electrode layer.

According to the present invention, the spacer elements may comprise pillars, and said pillars may be hour-glass shaped pillars.

Figure 2A:
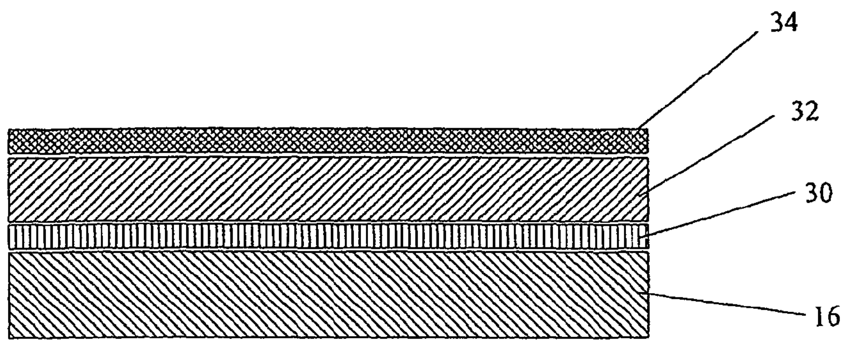
Figure 2B:
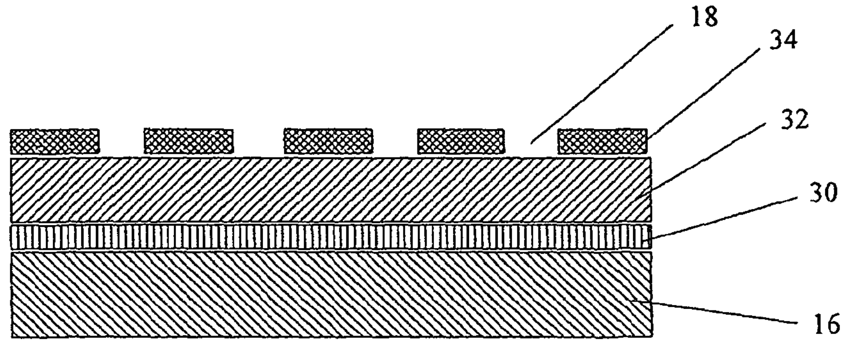
Figure 2C:
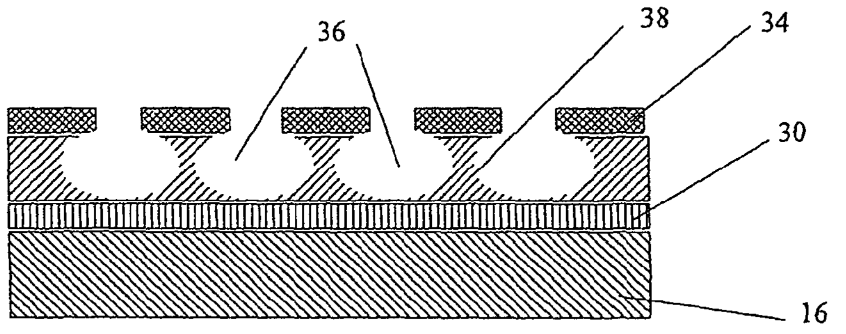
Figure 3A:
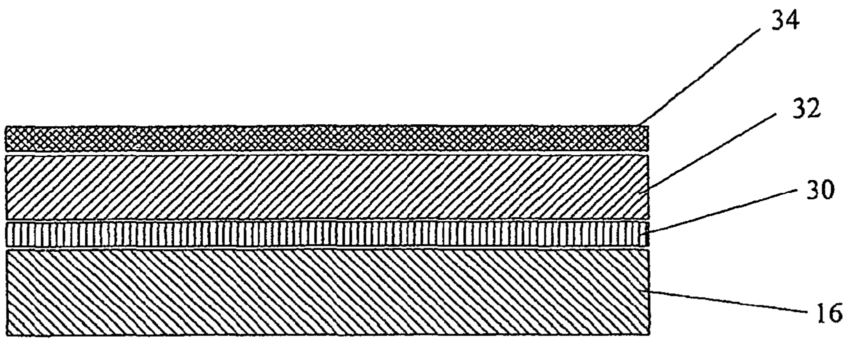
Figure 3B:
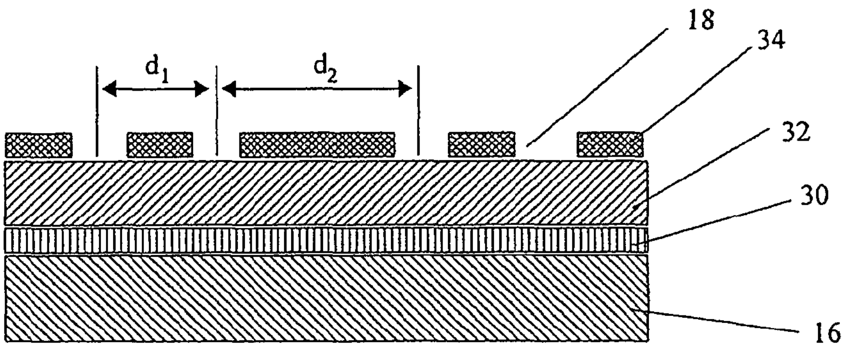
Figure 3C:
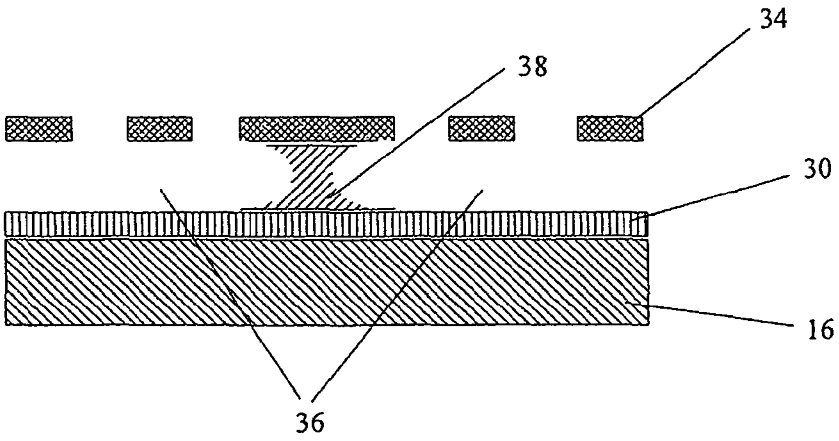

The method according to the present invention can be best understood from the description of the accompanying figures, in which FIGS. 1*a* and 1*b* are schematic perspective views of a prior art Micromegas detector described above;

FIGS. 2*a* to 2*c* are schematic side views of a Micromegas detector illustrating a first embodiment of the method according to the present invention; and FIGS. 3*a* to 3*c* are schematic side views of a Micromegas detector illustrating a second embodiment of the method according to the present invention.

The structure and operation of a Micromegas detector has been described above with reference to FIG. 1*a* and FIG. 1*b*. The present invention relates to an improved method for forming the amplification gap between the anode 8 and the cathode 6 by means of selective etching, and will be described below with reference to FIGS. 2*a* to 2*c*. An alternative embodiment is described further below with respect to FIGS. 3*a* to 3*c*.

FIG. 2*a* is a schematic side view of a foil used to fabricate the amplification gap according to the method of the present invention. The foil is formed on a carrier substrate 16 and consists of a first electrode layer 30, a bulk layer 32 formed on said first electrode layer 30, and a second electrode layer 34 formed on said bulk layer 32 in parallel to said first electrode layer 30. The first electrode layer 30 comprises a plurality of copper strips, which extend parallel to one another on the carrier substrate 16, and serve as elementary electrodes to collect the electrons generated in the amplification process. The drawing of FIG. 2*a* is a section through such an elementary electrode.

In the embodiment shown in FIG. 2*a*, the elementary electrodes consist of copper strips of a width of roughly 5 μm. Other metals at other widths may likewise be employed to form the elementary electrodes. In an alternative embodiment, the elementary electrodes comprise pads that can be made in any desired shape and are connected to a conducting material on the other side of the carrier substrate 16 through small metal-plated holes. Variations of such two-dimensional readouts are described in Section 5 of A. Bressan et al., "Two-dimensional readout of GEM detectors", Nuclear Instruments and Methods in Physics Research A 425 (1999) 254-261, which is incorporated in the present disclosure by reference. Alternatively, individual pads can be manufactured in the first electrode layer in the desired shape and can be individually connected to the readout means without any interconnection between neighbouring pads. Individual readout leads to particularly high spatial and energy resolution, but requires the use of very high density electronics in the readout means. The readout layer can be manufactured by conventional printed circuit board technology, either at the time of preparing the foil or afterwards.

The bulk layer 32 formed on said first electrode layer 30 consists of a dielectric material, for example a thin polyimide film with a width between 25 and 50 μm. Such a polyimide film is commercially available under the name Kapton from DuPont. Alternatively, the bulk layer 32 could be formed from other dielectric materials such as glass, ceramics, or FR4 (an abbreviation for flame-retardant 4, a material conventionally used for making printed circuit boards). Good results have been obtained with G2300 polyimide foil commercially available from Sheldahl, but similar products can also be used.

The second electrode layer 34 formed on said bulk layer 32 consists of a thin foil of copper at a width of approximately 5 μm. A metal other than copper can likewise be used to form the second electrode layer 34.

In order to form the holes 18 in the second electrode layer 34, standard photolithography can be used. A mask corresponding to the desired surface structure with holes at determined positions and with determined diameters is produced by forming a thin photoresistive film on the surface of the second electrode layer 34, exposing the same with ultraviolet light according to the hole pattern to be formed and subsequently developing it to remove the exposed or unexposed portions thereof, depending on the type of photoresist used. The copper is subsequently removed in the areas that are not protected by the photoresist, producing the desired pattern of a thin mesh. FIG. 2*b* shows the resulting structure with circular holes 18 formed at equidistant positions in said second electrode layer 34. For ease of presentation, only one of the holes is denoted with a reference numeral. All the holes 18 have equal diameters of about 30 μm, and the distance between any two neighbouring holes is roughly twice the diameter of said holes 18. The invention is not limited to circular holes. In principle, holes can be fabricated in a variety of shapes including rectangular or square holes. However, electrodes employing circular holes have been found to provide a very homogeneous field and excellent energy resolution, and are hence preferred.

In a subsequent step, the bulk material below the holes 18 is removed by means of etching through the holes 18 to form gaps 36 in the bulk material. The polyimide etching is performed at a temperature of at least 25° C. (preferably 65-70° C.) using a static bath of an aqueous ethylenediamine solution to which potassium hydroxide has been added. Good results are obtained with a solution containing one third water and two thirds ethylenediamine to which at least 70 g of potassium hydroxide per litre has been added at 65° C. A similar polyimide etching process is described in US patent application U.S. 2005/0011856 A1 in the context of the fabrication of high density printed circuits.

By means of the etching, the second electrode layer 34 is partially undercut by the gaps 36 in the bulk layer 32, so that hour-glass-shaped pillars made of bulk material are left between any two neighbouring gaps. The resulting structure is illustrated in FIG. 2*c*. The pillars serve as spacer elements 38, which separate the first electrode layer 30 and the second electrode layer 34 and keep them at a constant mutual distance. The plurality of gaps 36 formed between the pillars by means of the etching together form the amplification gap of the Micromegas detector.

In the embodiment described with reference to FIGS. 2*a* to 2*c*, the positions of the holes 18 in the second electrode layer 34 are chosen in such a way that the pillars 38 are formed on the elementary electrodes 14. Alternatively, the positions of the holes 18 may be chosen such that the pillars 36 are formed on the dielectric material separating the elementary electrodes. The positions at which pillars 36 are formed in the bulk layer are selected in accordance with the form and structure of the elementary electrodes 14. For instance, pillars can be formed in a rectangular pattern with a 100 μm pitch for 50 μm thick polymer foil and down to a 60 μm pitch for a 25 μm foil. In this embodiment, the cross-section illustrated in FIGS. 2 and 3 could represent either a cut in the X direction and the Y direction of the detector, as such cuts would look the same for the depicted fraction of the device.

A second embodiment of a method for forming the amplification gap of a Micromegas detector is illustrated in FIGS. 3*a* to 3*c*. The method differs from the method of the previous embodiment described with reference to FIGS. 2_a_ to 2_c_ mainly in that the holes 18 in the second electrode layer 34 are not formed at equidistant positions. As shown in FIG. 3_b_, neighbouring holes are either separated by a first distance $d_1$, or a second distance $d_2$ larger than $d_1$. The polyimide etching then proceeds as described with respect to the previous embodiment, but the etching parameters are chosen in such a way that the bulk material between gaps 36 that correspond to holes at the smaller distance $d_1$ is entirely removed, and pillars 38 of bulk material are only left between gaps 36 formed from holes that are separated by the larger distance $d_2$. In the resulting structure shown in FIG. 3_c_, the pillars 38 are about 100 μm in diameter and have a mutual distance of about 1 mm.

The method according to the second embodiment also results in a formation of an amplification gap between the first electrode layer 30 and the second electrode layer 34. However, when compared with the structure resulting from the previous embodiment, the second electrode layer 34 is supported by fewer yet thicker pillars 38. Due to the smaller number of pillars 38, the resulting electrical field between the first electrode layer 30 and the second electrode layer 34 is more homogeneous, and the likelihood of discharges is reduced.

The invention provides a method for forming the amplification gap of an avalanche particle detector by means of etching of a dielectric layer sandwiched between two thin metallic layers. As discussed in detail above, the inventive method has numerous advantages when compared to conventional methods of forming Micromegas detectors. In particular, the invention allows for a quick manufacturing of an amplification structure with a high degree of uniformity, leading to excellent spatial and energy resolution. While the technique has been described above with reference to the Micromegas detector, it will be evident to those skilled in the art that the same technique can be applied with similar advantages in the construction of other types of detectors or electron multipliers. In fact, the invention is effective whenever a structure of two metallic plates separated by dielectric spacer elements at a carefully controlled distance is desired.

The embodiments described above and the accompanying figures merely serve to illustrate the method according to the present invention, and should not be taken to indicate any limitation of the method. The scope of the patent is solely determined by the following claims.

The invention claimed is:

1. A method for fabricating an amplification gap of an avalanche particle detector in which two parallel electrodes (6, 8) are spaced apart by dielectric spacer elements, comprising the steps of:

forming a foil including a first electrode layer (30), a bulk layer (32) comprising a dielectric material on said first electrode layer (30), and a second electrode layer (34) parallel to said first electrode layer (30) on said bulk layer (32), wherein said second electrode layer (34) comprises a plurality of holes (18) extending through said second electrode layer (34);

forming a plurality of gaps (36) in said bulk layer (32) in correspondence to said plurality of holes (18) in said second electrode layer (34) by means of etching, wherein said gaps (36) extend through said bulk layer (32) in a vertical direction thereof to said first electrode layer (30) and in a horizontal direction thereof parallel to said second electrode layer (34) so that said second electrode layer (34) is at least partially undercut by said gaps (36), wherein said gaps (36) are etched using an aqueous solution comprising ethylenediamine and potassium hydroxide; and wherein neighbouring holes (18) in said second electrode layer (34) are formed at varying mutual distances, said varying mutual distances comprising a first distance (d1) and a second distance (d2) greater than said first distance (d1), and wherein the bulk layer between neighbouring gaps (36) is entirely removed by means of the etching between gaps (36) that are formed from neighbouring holes (18) at said first distance (d1), and wherein spacer elements (38) of bulk material are left by the etching between those gaps (36) that are formed from neighbouring holes (18) at said second distance (d2).

2. The method according to claim 1, further comprising forming step said plurality of holes (18) in said second electrode layer (34) by means of photolithography.

3. The method according to claim 1, wherein a plurality of elementary electrodes (14) are formed in said first electrode layer (30), and said elementary electrodes (14) are insulated from each other.

4. The method according to claim 3, wherein said elementary electrodes (14) comprise a plurality of electrically conducting parallel strips.

5. The method according to claim 1, wherein said bulk layer (32) comprises one of polyimide, glass, or ceramics.

6. The method according to claim 1, wherein said bulk layer (32) is formed at a width between 25 and 50 μm.

7. The method according to claim 1, wherein said gaps (36) are formed by means of liquid-phase etching.

8. The method according to claim 7, wherein said gaps (36) are etched at a temperature of 65° C. to 70° C.

9. The method according to claim 1, wherein said step of forming said plurality of gaps (36) comprises the step of first forming cylindrical openings within said bulk layer (32) subjacent to said holes (18) in said second electrode layer (34) in a vertical direction thereof by means of a first etching, and then etching sideways from said cylindrical openings in a direction parallel to said first electrode layer (30) by means of a second etching.

10. The method according to claim 1, wherein spacer elements (38) of bulk material are formed between two neighbouring gaps (36) by means of said etching.

11. The method according to claim 10, wherein said spacer elements (38) comprise hour-glass-shaped pillars.

* * * * *